United States Patent [19]
Partlo et al.

[11] Patent Number: 5,940,421
[45] Date of Patent: Aug. 17, 1999

[54] CURRENT REVERSAL PREVENTION CIRCUIT FOR A PULSED GAS DISCHARGE LASER

[75] Inventors: William N. Partlo, San Diego; Daniel L. Birx, Oakley; Richard M. Ness, San Diego, all of Calif.

[73] Assignee: Cymer, Inc., San Diego, Calif.

[21] Appl. No.: 08/990,848

[22] Filed: Dec. 15, 1997

[51] Int. Cl.$^6$ ................................................. H01S 3/00
[52] U.S. Cl. ............................................................ 372/38
[58] Field of Search ........................................ 372/38, 82

[56] References Cited

U.S. PATENT DOCUMENTS

| | | |
|---|---|---|
| 3,806,829 | 4/1974 | Duston et al. . |
| 3,849,670 | 11/1974 | Lourigan . |
| 4,549,091 | 10/1985 | Fahlen et al. . |
| 4,674,022 | 6/1987 | Ver Planck . |
| 4,803,378 | 2/1989 | Richarson . |
| 4,975,924 | 12/1990 | Iwata et al. . |
| 5,066,928 | 11/1991 | Ikezi et al. . |
| 5,072,191 | 12/1991 | Nakajima et al. . |
| 5,124,629 | 6/1992 | Ball et al. . |
| 5,138,193 | 8/1992 | Bruno et al. . |
| 5,138,622 | 8/1992 | Fried et al. . |
| 5,142,166 | 8/1992 | Birx . |
| 5,177,754 | 1/1993 | Ball et al. ................................. 372/38 |
| 5,235,608 | 8/1993 | Konishi . |
| 5,309,462 | 5/1994 | Taylor et al. ............................. 372/38 |
| 5,313,481 | 5/1994 | Cook et al. ................................ 372/38 |
| 5,315,611 | 5/1994 | Ball et al. ................................. 372/38 |
| 5,319,665 | 6/1994 | Birx . |
| 5,359,279 | 10/1994 | Gidon et al. ............................. 372/82 |
| 5,448,580 | 9/1995 | Birx et al. ................................. 372/38 |
| 5,471,492 | 11/1995 | Pidgeon et al. . |
| 5,514,918 | 5/1996 | Inatomi et al. . |
| 5,729,562 | 3/1998 | Birx et al. ................................. 372/38 |

FOREIGN PATENT DOCUMENTS

| | | |
|---|---|---|
| 80143331 | 10/1980 | Japan . |
| 63-171172 | 7/1988 | Japan . |
| 06164040 | 6/1994 | Japan . |
| 06237153 | 8/1994 | Japan . |
| 2204728 | 11/1988 | United Kingdom . |
| WO 89/10657 | 11/1989 | WIPO . |
| WO 93/00743 | 1/1993 | WIPO . |

OTHER PUBLICATIONS

W.S. Melville, "The Use of Saturable Reactors as Discharge Devices for Pulse Generators," Sep. 15, 1950, Radio Section, Paper No. 1034, pp. 185–207.

E.M. Lassiter, et. al., "High–Power Pulse Generation Using Semiconductors and Magnetic Cores," Nov. 1960. AIEE Summer General Meeting, pp. 511–517.

D.L. Birx, et. al., "Basic Principles Governing the Design of Magnetic Switches," Nov. 18, 1980, Lawrence Livermore Laboratory Publication UCID–18831.

Birx, et. al., "The Application of Magnetic Pulse Compression to the Grid System of the ETA/ATA Accelerator," 1982, *IEEE* pp. 10–13.

Birx, et. al., "Magnetic Compressors: High–Power Pulse Sources," Aug. 1983, Lawrence Livermore Laboratory Energy and Technology Review, pp. 11–19.

B.T. Merritt, et. al., "Development and Operation of a Solid–State Switch for Thyratron Replacement," Jun. 14, 1991, Lawrence Livermore Laboratory Publication UCR-L–JC–105355.

*Primary Examiner*—Leon Scott, Jr.
*Attorney, Agent, or Firm*—William B. Tiffany

[57] ABSTRACT

A simple, novel pulse power circuit is described, which improves the net coupling efficiency of a pulse power system used to drive a gas discharge laser, and minimizes current reversal and electrode erosion. The circuit, in accordance with an embodiment of the present invention, incorporates a saturable inductor. Contrary to conventional saturable inductor configurations, in which the saturable inductor is either not saturated or is presaturated in a reverse direction, in the present circuit the saturable inductor is presaturated in the forward direction.

The saturable inductor is inserted between the final stage capacitor of a pulse power circuit and a gas discharge load, where it allows forward current but effectively blocks reverse current through the load. Elimination of reverse discharge current reduces electrode erosion and improves discharge chamber life.

46 Claims, 4 Drawing Sheets

CURRENT REVERSAL PREVENTION CIRCUIT FOR A PULSED GAS DISCHARGE LASER

CROSS REFERENCE TO RELATED APPLICATIONS

This application is related to Birx et al application Ser. No. 08/739,873, filed Oct. 31, 1996, which is incorporated herein by reference in its entirety.

FIELD OF THE INVENTION

The present invention relates generally to pulse power sources and more particularly, to an apparatus and method for providing high voltage pulse power with minimal current reversal for application with excimer and other gas discharge lasers.

BACKGROUND

The use of electrical pulse compression circuits to create high voltage, high current, short duration electrical pulses for use with gas discharge lasers has been well described.

The design of a pulse power system to drive a gas discharge laser is difficult due to the time varying impedance of the load. As the laser gas between the electrodes of a transverse discharge pumped laser undergoes electron avalanche, the current carrier density between the electrodes increases many orders of magnitude on a time scale between 10 ns to 100 ns. This increase in carrier density causes the gas impedance to decrease many orders of magnitude. Illustratively, discharge impedances can range from megohms when nonconducting to 0.1 ohm when fully conducting. Typical electrical drive circuits can efficiently couple power into fixed load impedances only, and thus exhibit poor coupling efficiency into a time varying impedance encountered in a gas discharge laser. A consequence of this poor coupling efficiency is current reversal in the gas discharge, leading to erosion and damage of the electrodes, wasted energy in the discharge after the lasing and optical properties of the gas have degraded, and unwanted reflection of energy into the pulse power system.

Specialized pulse power systems have been developed to improve the power coupling into gas discharge lasers. An example of such a system is a "spiker/sustainer". A spiker/sustainer comprises two separate pulse power systems, one optimized for coupling to the initially high impedance of the gas discharge and the other optimized for coupling into the subsequent lower impedance of the gas discharge. Such systems are complicated, unreliable, and expensive to manufacture.

Accordingly the art needs a reliable, uncomplicated pulse power system, that more efficiently couples pulse energy into a time-varying impedance of a gas discharge with minimal current reversal and electrode erosion.

SUMMARY OF THE INVENTION

In accordance with the present invention, a simple, novel pulse power circuit is described, which improves the net coupling efficiency of a pulse power system used to drive a gas discharge laser, and minimizes current reversal and electrode erosion. The circuit, in accordance with an embodiment of the present invention, incorporates a saturable inductor. Contrary to conventional saturable inductor applications, in which the saturable inductor is either not saturated or is presaturated in a reverse direction, in the present circuit the saturable inductor is presaturated in the forward direction.

The saturable inductor is inserted between the final stage capacitor of a pulse power circuit and a gas discharge load, where it allows forward current but effectively blocks reverse current through the load. Elimination of reverse discharge current reduces electrode erosion and improves discharge chamber life.

DETAILED DESCRIPTION OF THE EMBODIMENTS

The present invention relates generally to pulse power sources and more particularly, to an apparatus and method for providing high voltage pulse power with minimal current reversal for application with excimer and other gas discharge lasers.

Figure 1:
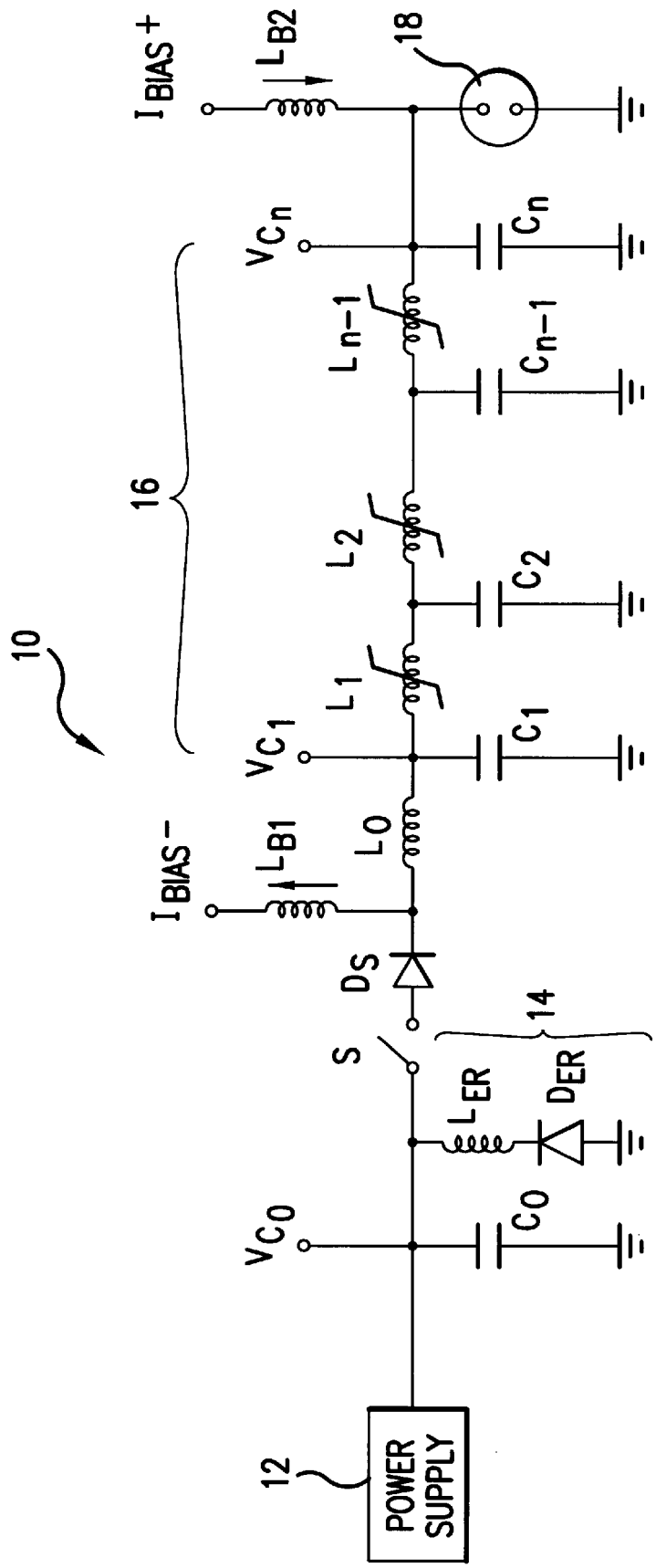
FIG. 1 is a schematic diagram of an embodiment of a pulse power generating circuit 10 with energy recovery in accordance with Birx et al application Ser. No. 08/739,873.

FIG. 1 is a schematic diagram of an embodiment of a pulse power generating circuit 10 with energy recovery in accordance with Birx et al application Ser. No. 08/739,873, cited above (hereinafter Birx et al 1996). Circuit 10 comprises a high voltage DC power supply 12, an energy storage capacitor $C_0$, an inverting circuit 14 which comprises inductor $L_{ER}$ and energy recovery diode $D_{ER}$, a solid state switch S, and a pulse compressor circuit 16 for compressing the duration and increasing the peak power of pulses applied to a load 18, typically a pulse discharge such as an excimer laser.

Compressor circuit 16 comprises banks of capacitors $C_1$, $C_2$, ... $C_{n-1}$, and $C_n$ and one or more saturable inductors $L_1$, $L_2$, ..., $L_{n-1}$ connected into a conventional ladder network. Thus, a first saturable inductor $L_1$ is connected between capacitors $C_1$ and $C_2$, a second saturable inductor $L_2$ may be connected in series between capacitors $C_2$ and $C_3$, ..., and a saturable inductor $L_{n-1}$ is connected in series between $C_{n-1}$ and $C_n$.

Circuit 10 preferably further comprises a diode $D_s$ connected in series with the switch S to ensure that circuit 10 is nonconductive with respect to reverse current. Circuit 10 further comprises an inductor $L_0$ selected in conjunction with capacitor $C_1$ to provide a time constant for the LC combination to slow the buildup of current through switch S that could otherwise damage switch S.

Circuit 10 also incorporates a bias circuit defined by bias current source $I_{BIAS-}$, $I_{BIAS+}$. Bias inductors $L_{B1}$, $L_{B2}$, are each connected at one end to bias current source $I_{BIAS-}$, $I_{BIAS+}$, respectively, and at the other end to compressor circuit 16. As shown in FIG. 1, bias current source $I_{BIAS-}$, $I_{BIAS+}$ supplies a negative current relative to the desired output pulse polarity, which presaturates saturable inductors $L_1$, $L_2$, ..., $L_{n-1}$ of compressor circuit 16. Inductors $L_{B1}$, $L_{B2}$ have relatively high inductance values to provide relatively long time constants in the bias circuit relative to those of compressor circuit 16, thereby isolating bias current source $I_{BIAS-}$, $I_{BIAS+}$ from pulse power.

In operation as described by Birx et al 1996, switch S closes to discharge a power pulse from energy storage capacitor $C_0$ into compressor circuit 16, where the pulse width is narrowed and pulse amplitude is increased as the pulse is transferred successively through the saturable inductors $L_1, L_2, \ldots, L_{n-1}$ of the ladder network of compressor circuit 16 toward load 18.

At the end of the pulse transfer cycle, when the voltage $VC_n$ on capacitor $C_n$ reaches the threshold voltage $V_{th}$ for avalanche breakdown of load 18, load 18 becomes conducting, and pulse power having a positive polarity is delivered from capacitor $C_n$ through load 18. After discharging, capacitor $C_n$ is driven to a negative polarity charge, because of impedance mismatch between circuit 10 and load 18. When this occurs, saturable inductor $L_{n-1}$ is already presaturated with respect to forward current from capacitor $C_{n-1}$ to capacitor $C_n$. Thus, instead of having energy ringing in load 18, for example eroding the electrodes, the reverse charge on capacitor $C_n$ is instead transferred resonantly back into capacitor $C_{n-1}$. This transfer is accomplished by a forward flow of current through saturable inductor $L_{n-1}$.

When the energy is transferred back into capacitor $C_{n-1}$, capacitor $C_{n-1}$ is driven negative with respect to capacitor $C_{n-2}$. This process cascades up the L-C ladder network of compressor circuit 16 and continues until the energy in capacitor $C_n$ is passed to capacitor $C_0$. It should be noted that such reverse transfer of energy is possible only if all saturable inductors $L_n, \ldots L_{n-1}$ remain forward conducting. Thus, an important factor in the design of compressor circuit 16 is for the recovery time constants after transfer of the forward pulse current to be long enough relative to the pulse power transfer time for all saturable inductors $L_1, L_2, \ldots L_{n-1}$ to remain forwardly conducting for one way current transfer until waste energy is fully recovered. On a longer time scale, reverse bias current from bias current source $I_{BIAS-}$, $I_{BIAS+}$ restores saturable inductors $L_n, \ldots L_{n-1}$ to their original reverse presaturated condition for compression of the next pulse.

Energy recovery is further facilitated by inverting circuit 14 which comprises inductor $L_{ER}$ and energy recovery diode $D_{ER}$ coupled to ground. When the waste energy is propagated back into capacitor $C_0$, capacitor $C_0$ is driven negative with respect to its initially stored charge, and switch S is open. Inverting circuit 14 reverses this polarity through resonant free wheeling (a half cycle of ringing of the $L_{ER}$-$C_0$ circuit as clamped against reversal of the current in inductor $L_{ER}$ by diode $D_{ER}$), with the net result that energy is recovered by the partial recharging of capacitor $C_0$.

In an alternative embodiment according to Birx et al 1996, a step up transformer (not shown) is inserted in circuit 10 between capacitor $C_n$ and load 18, at capacitor $C_1$, or at any capacitor between capacitor $C_1$ and capacitor $C_n$. The presence and location of the transformer does not effect the operation of the other components of the pulse power supply, provided that the values, current capacities and voltage capabilities of the components from and including power supply 12 to the primary winding of the transformer will differ substantially, because of the impedance change introduced by the transformer.

Illustratively, in circuit 10 the output voltage of power supply 12 is in a range of from 1 kV to 2 kV, the forward output pulse voltage of capacitor $C_n$ is in a range of from 10 kV to 20 kV, and the reverse voltage on capacitor $C_n$ is in a range of from 5 kV to 15 kV.

Figure 2:
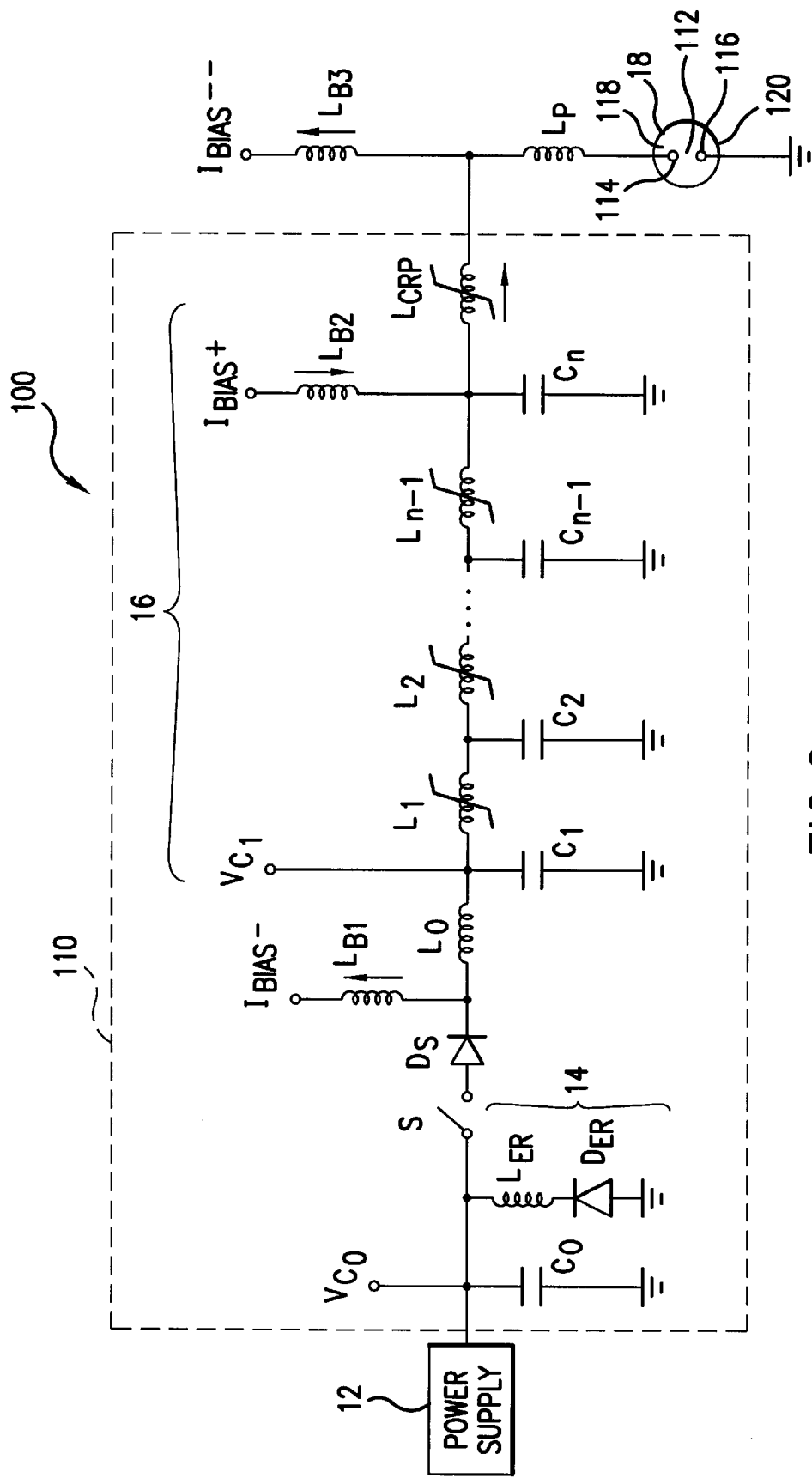
FIG. 2 is a schematic diagram of a pulse power circuit incorporating energy recovery and configured to prevent current reversal through the load.

FIG. 2 is a schematic diagram of a pulse power circuit 100 in accordance with the present invention, incorporating energy recovery and configured to prevent current reversal through the load. Circuit 100 is substantially identical with circuit 10 of Birx et al 1996 (see FIG. 1), with the single addition of a saturable inductor $L_{crp}$ inserted between last stage capacitor $C_n$ and load 18. Elements in the various figures which are substantially similar are designated by similar reference numbers.

A pulse power system 110 capable of energy recovery is used to drive load 18 comprising a gas discharge 112 between transverse electrodes 114, 116 inside a discharge chamber 120 containing laser gas 118. Contrary to saturable inductors $L_n, \ldots L_{n-1}$, saturable inductor $L_{crp}$ is presaturated in a forward saturated direction (indicated by an arrow). A second bias current circuit is added, comprising bias current source $I_{BIAS+}$, $I_{BIAS--}$, which is connected through saturable inductor $L_{crp}$ and bias inductors $L_{B2}$ and $L_{B3}$, respectively. Bias current source $I_{BIAS--}$, $I^{BIAS+}$ supplies a positive current relative to the desired output pulse polarity, which presaturates saturable inductor $L_{crp}$ in the forward direction. In this configuration saturable inductor $L_{crp}$ presents only a small inductance to forward current from last stage capacitor $C_n$ to discharge 112, but presents a large inductance to reverse current.

In operation during the pulse transfer cycle (transfer of pulse power from capacitor $C_0$ through capacitor $C_n$ to load 18, circuit 100 behaves identically to circuit 10 (see FIG. 1). Similarly, at the end of the pulse transfer cycle, when voltage $VC_n$ on capacitor $C_n$ reaches the threshold voltage $V_{th}$ for avalanche breakdown of load 18, load 18 becomes conducting, and the pulse power is delivered from capacitor $C_n$ through saturable inductor $L_{crp}$ and through a small discharge head inductance $L_h$ (associated with electrodes 114, 116 and related electrical leads) into load 18. Since saturable inductor $L_{crp}$ presents only a small inductance for forward current relative to discharge head inductance $L_h$, it has negligible effect on the forward propagation of pulse power. After discharging, capacitor $C_n$ is driven negative, because of impedance mismatch between circuit 10 and load 18.

If saturable inductor $L_{crp}$ were not present, the negative voltage on capacitor $C_n$ would drive current through load 18 in the reverse direction. Reverse current through a discharge 112 is known to produce detrimental eroding of electrodes 114, 116 and thus to shorten the service life of discharge chamber 120.

Unlike saturable inductors $L_1, L_2, \ldots, L_{n-1}$ contained in compressor circuit 16, saturable inductor $L_{crp}$ does not change saturation, but remains saturated in the forward direction throughout the forward transfer of pulse power. Therefore, saturable inductor $L_{crp}$ selectively blocks reverse current through load 18 by presenting a large value of inductance to any current flowing in the reverse direction, essentially an open circuit on these time scales. In this configuration, forward presaturated saturable inductor $L_{crp}$ behaves analogously to a forward biased diode.

The reverse unsaturated inductance of saturable inductor $L_{crp}$ is typically two orders of magnitude larger than its forward saturated inductance. This larger reverse inductance slows the reverse current through capacitor $C_n$, discharge head inductance $L_h$, and saturable inductor $L_{crp}$ sufficiently to promote the recovery of energy from capacitor $C_n$ into capacitor $C_{n-1}$ by resonant transfer through saturable inductor $L_{n-1}$. The recovered energy then cascades backward through compressor circuit 16 into energy storage capacitor $C_0$ similar to the operation of circuit 10 (see FIG. 1), here it is captured and stored for the next pulse transfer cycle.

Importantly, saturable inductor $L_{crp}$ is configured th inductance in the reverse direction adequate to low reverse current until all overshoot energy on capacitor $C_n$ is recovered into compressor circuit 16. Once capacitor $C_n$ is drained of energy, there is no further voltage to initiate or sustain reverse current through discharge 112. Additionally, as the voltage on capacitor $C_n$ drops, the impedance of discharge gas, e.g. laser gas 118, between electrodes 114, 116 rises above the threshold for current conduction, i.e. laser gas 118 returns to an electrically insulating condition, thereby further blocking detrimental reverse current.

Figure 3A:
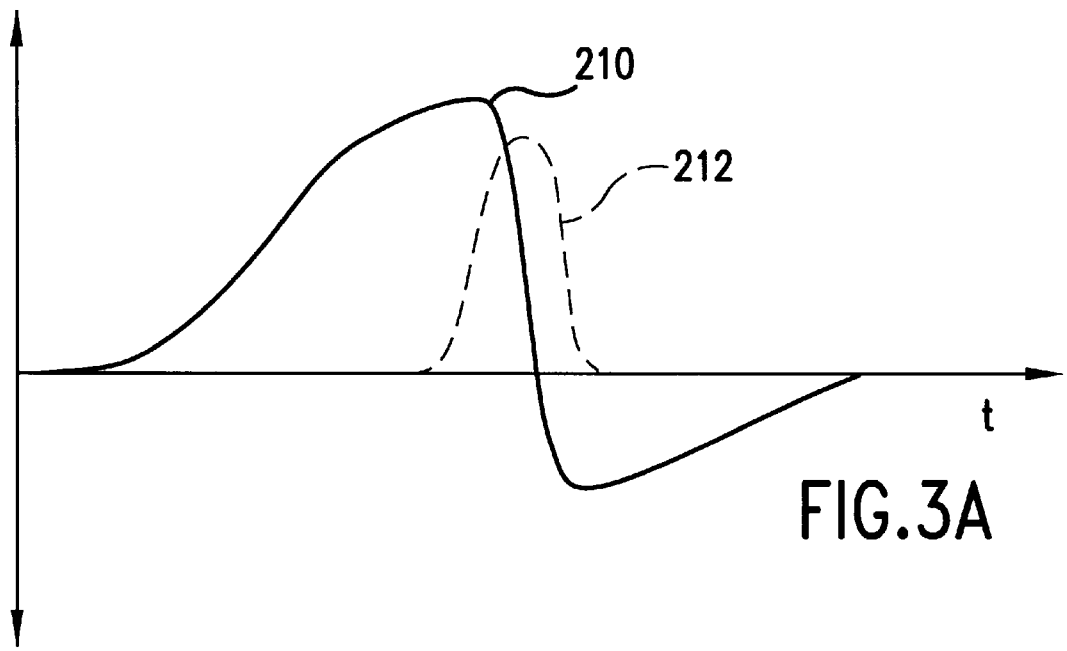
FIG. 3 is a graphical representation of typical discharge current and voltage waveforms at capacitor $C_n$ with and without saturable inductor $L_{crp}$.
Figure 3B:
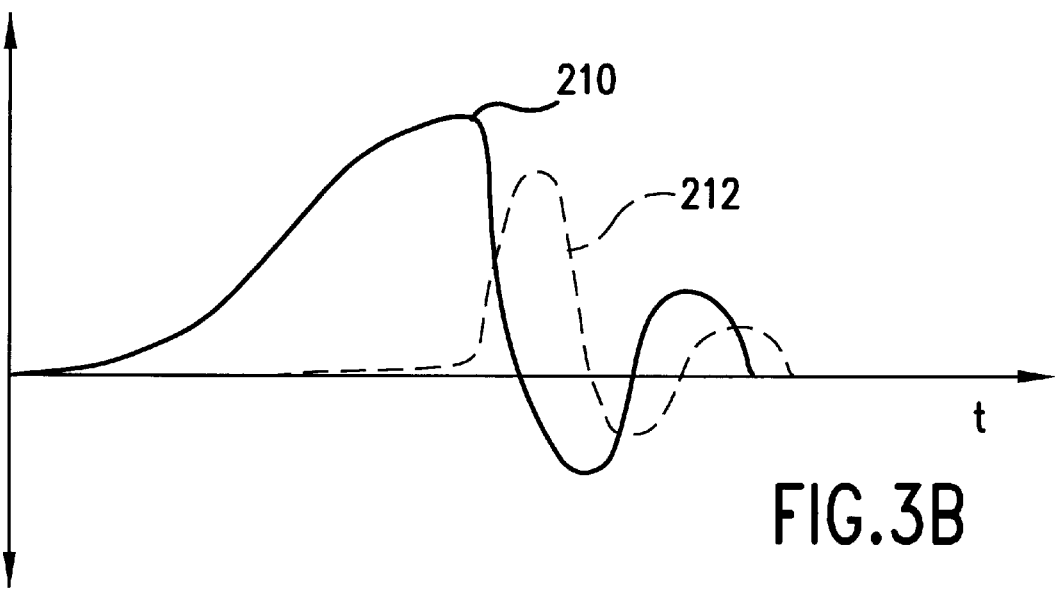

FIG. 3 is a graphical representation of typical discharge current and voltage waveforms at capacitor $C_n$ with and without saturable inductor $L_{crp}$. Horizontal and vertical scales of FIG. 3 and relative. Waveforms are superimposed on the same relative horizontal time scale. Illustratively, discharge current durations are in a range of from 10 nsec to 100 nsec. Peak voltages are typically in a range of from 10 kv to 20 kV.

Voltage waveform 210 and current waveform 212 are typical for circuit 100, which incorporates forward presaturated saturable inductor $L_{crp}$. As shown, the main discharge current pulse begins when voltage waveform 210 is near its peak, i.e. capacitor $C_n$ is nearly fully charged. Voltage waveform 210 drops sharply during the current pulse, and then overshoots to a maximum reverse voltage near the end of the main current pulse. Saturable inductor $L_{crp}$ prevents reversal of current waveform 212, and voltage waveform 210 decays to zero as energy is recovered back into compression circuit 16.

Shown graphically on an offset vertical scale are voltage waveform 214 and current waveform 216 typical of a circuit without saturable inductor $L_{crp}$, e.g. circuit 10. Although the initial behavior is similar to that shown in waveforms 210 and 212, respectively, without saturable inductor $L_{crp}$ there is nothing to prevent current reversal. Therefore, both voltage and current waveforms 214, 216 exhibit damped ringing behavior, which results in excessive and potentially detrimental reverse discharge current.

The large (100-fold or more) differential between the forward inductance and the reverse inductance of saturable inductor $L_{crp}$ arises from the fact that saturable inductor $L_{crp}$ is initially presaturated in the forward direction. This causes the saturable magnetic material internal to saturable inductor $L_{crp}$ to exhibit a lower permeability in the forward direction. However, saturable inductor $L_{crp}$ is unsaturated in the reverse direction and therefore has much higher permeability in the reverse direction. Since the inductance value of a saturable inductor is proportional to its permeability, saturable inductor $L_{crp}$ exhibits a large differential between lower forward and higher reverse inductances.

As illustrated in FIGS. 1 and 2, saturable inductors $L_1$, $L_2$, ..., $L_{-1}$, and $L_{crp}$ are presaturated by passing bias current through their respective main conductive windings. The bias current is generated by bias current source $I_{BIAS-}$, $I_{BIAS+}$, $I_{BIAS--}$, which in turn is isolated by bias inductors $L_{B1}$, $L_{B2}$, $L_{B3}$, respectively, from high current pulse power through saturable inductors $L_1$, $L_2$, ..., $L_{n-1}$, and $L_{crp}$.

Figure 4:
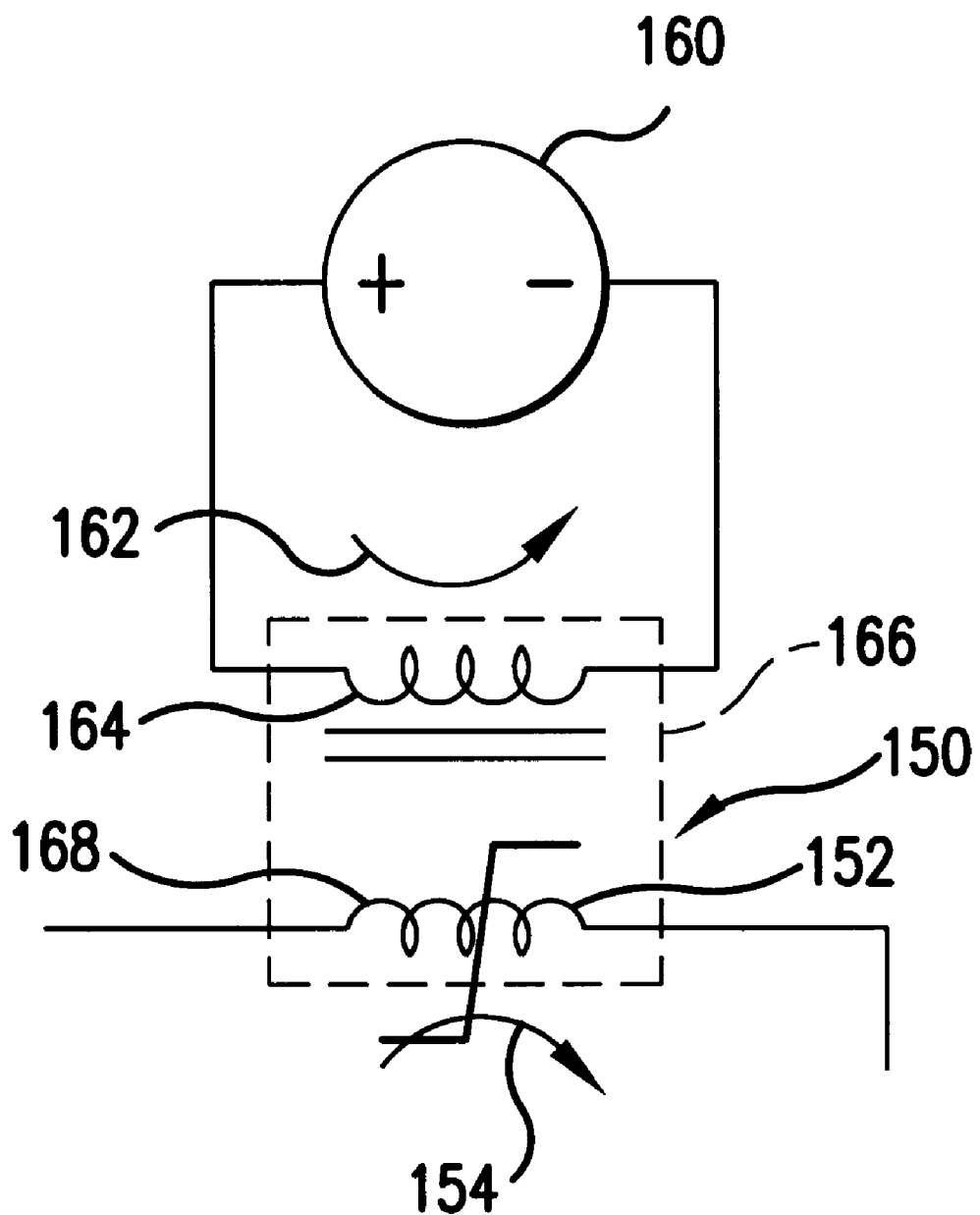
FIG. 4 is a schematic diagram showing an alternate approach for presaturating a saturable inductor.

FIG. 4 is a schematic diagram illustrating an alternative approach for presaturating a saturable inductor 150 in a direction indicated by an arrow 154. Bias source 160 generates a bias current 162 through the primary winding 164 of an isolation transformer 166. The secondary winding 168 of isolation transformer 166 comprises all or part of the main conductive winding 152 of saturable inductor 150. Bias current 162 is thereby coupled by isolation transformer 166 into saturable inductor 150. Because of isolation transformer coupling between primary winding 164 and secondary winding 168, there is no steady state transfer of bias current into saturable inductor 150, but instead there is an intermittent transfer of bias current, if and only if saturable inductor 150 is not fully saturated in the direction of the bias current. Accordingly, the alternative approach shown in FIG. 4 provides "on demand" presaturation of saturable inductor 150, and thereby offers a potential advantage of greater efficiency.

In accordance with the present invention, a saturable inductor is inserted between the final stage capacitor and the load of a pulse power circuit. Unlike other saturable inductors, the saturable inductor in accordance with the present invention is presaturated in the forward direction. This forward saturated saturable inductor connected in series with a gas discharge load allows forward current but effectively blocks reverse current through the gas discharge load. Elimination of reverse discharge current reduces electrode erosion and thus improves discharge chamber life. Thereby the addition of a forward presaturated saturable inductor into a pulse power circuit in accordance with the present invention constitutes a novel and significant advance in the art.

Although the invention has been described in terms of a certain preferred embodiment, other embodiments apparent to those skilled in the art are also within the scope of this invention. Accordingly, the scope of the invention is intended to be defined only by the claims which follow.

What is claimed is:

1. A pulse power generating circuit comprising:
   a capacitor for storing a charge;
   a pulse compressor circuit having a first terminal and a second terminal, said first terminal of said compressor circuit being connected to said capacitor;
   a saturable inductor having a first terminal and a second terminal, said first terminal of said saturable inductor being connected to said second terminal of said compressor circuit, said saturable inductor being presaturated to have a first inductance in a first direction extending from said first terminal toward said second terminal of said saturable inductor and a second inductance larger than said first inductance in a second direction opposite said first direction; and
   a switch for applying said charge stored in said capacitor as an input to said first terminal of said compressor circuit, said compressor circuit supplying an output pulse into said saturable inductor in said first direction in response to said input.

2. The circuit of claim 1, wherein said compressor circuit is interconnected with a load through said saturable inductor, said load receiving said output pulse.

3. The circuit of claim 2, wherein said load comprises a gas discharge.

4. The circuit of claim 3, wherein said gas discharge is operable between transverse discharge electrodes.

5. The circuit of claim 3, wherein said gas discharge energizes a pulsed gas discharge laser.

6. The circuit of claim 5, wherein said pulsed gas discharge laser is an excimer laser.

7. The circuit of claim 6, wherein said excimer laser is selected from the group consisting of KrF excimer lasers and ArF excimer lasers.

8. The circuit of claim 1, wherein said saturable inductor is presaturated by means of a bias current source.

9. The circuit of claim 8, wherein said bias current source is interconnected with said saturable inductor through at least one linear inductor.

10. The circuit of claim 8, wherein said bias current source is coupled with said saturable inductor through an isolation transformer.

11. A high voltage pulse power laser system, comprising:
a capacitor for storing a charge;
a pulse compressor circuit having a first terminal and a second terminal, said first terminal of said compressor circuit being connected to said capacitor;
a saturable inductor having a first terminal and a second terminal, said first terminal of said saturable inductor being connected to said second terminal of said compressor circuit, said saturable inductor being presaturated to have a first inductance in a first direction extending from said first terminal toward said second terminal of said saturable inductor and a second inductance larger than said first inductance in a second direction opposite said first direction;
a switch for applying said charge stored in said capacitor as an input to said first terminal of said compressor circuit, said compressor circuit supplying an output pulse into said saturable inductor in said first direction in response to said input; and
a laser interconnected with said compressor circuit through said saturable inductor and ground, said laser receiving said output pulse.

12. The laser system of claim 11, wherein said laser is a pulsed gas discharge laser operable between transverse discharge electrodes.

13. The laser system of claim 11, wherein said laser is an excimer laser.

14. The laser system of claim 13, wherein said excimer laser is selected from the group consisting of KrF excimer lasers and ArF excimer lasers.

15. The laser system of claim 11, wherein said saturable inductor is presaturated by means of a bias current source.

16. The laser system of claim 15, wherein said bias current source is interconnected with said saturable inductor through at least one linear inductor.

17. The laser system of claim 15, wherein said bias current source is coupled with said saturable inductor through an isolation transformer.

18. A pulse power generating circuit comprising:
a capacitor for storing a charge; and
a saturable inductor having a first terminal and a second terminal, said first terminal of said saturable inductor being interconnected with said capacitor, said saturable inductor being presaturated to have a first inductance in a first direction extending from said first terminal toward said second terminal of said saturable inductor and a second inductance larger than said first inductance in a second direction opposite said first direction.

19. The circuit of claim 18, wherein said second terminal of said saturable inductor is connected to a load.

20. The circuit of claim 19, wherein said load comprises a gas discharge.

21. The circuit of claim 20, wherein said gas discharge is operable between transverse discharge electrodes.

22. The circuit of claim 20, wherein said gas discharge energizes a pulsed gas discharge laser.

23. The circuit of claim 22, wherein said pulsed gas discharge laser is an excimer laser.

24. The circuit of claim 23, wherein said excimer laser is selected from the group consisting of KrF excimer lasers and ArF excimer lasers.

25. The circuit of claim 18, wherein said saturable inductor is presaturated by means of a bias current source.

26. The circuit of claim 25, wherein said bias current source is interconnected with said saturable inductor through at least one linear inductor.

27. The circuit of claim 25, wherein said bias current source is coupled with said saturable inductor through an isolation transformer.

28. A method of applying pulse power, comprising the steps of:
storing a charge in a capacitor;
applying said charge through a switch as an input to a pulse compressor circuit;
providing an output pulse from said compressor circuit in response to said input;
applying said output pulse in a first direction to a load through a saturable inductor connected in series with said load, said saturable inductor being presaturated to have a first inductance in said first direction and a second inductance larger than said first inductance in a second direction opposite said first direction; and
preventing current in said second direction through said load by means of said second inductance of said saturable inductor.

29. The method of claim 28, wherein said load is a gas discharge.

30. The method of claim 29, wherein said gas discharge energizes a pulsed gas discharge laser.

31. The method of claim 30, wherein said pulsed gas discharge laser is an excimer laser.

32. The method of claim 31, wherein said excimer laser is selected from the group consisting of KrF excimer lasers and ArF excimer lasers.

33. The method of claim 28, further comprising the step of presaturating said saturable inductor by applying a bias current.

34. The method of claim 33, wherein said bias current is applied to said saturable inductor through at least one linear inductor.

35. The method of claim 33, wherein said bias current is applied to said saturable inductor through an isolation transformer.

36. The method of claim 28, further comprising the step of recovering pulse power not used in said load and returning said pulse power not used in said load to said capacitor.

37. A method of preventing reverse pulse current through a load, comprising the steps of:
connecting a saturable inductor in series with a load;
applying pulse power from a capacitor in a forward direction to said load through said saturable inductor, said saturable inductor being presaturated to have a forward inductance in said forward direction and a reverse inductance larger than said forward inductance in a reverse direction opposite said forward direction; and
preventing current in said reverse direction through said load by means of said reverse inductance of said saturable inductor.

38. The method of claim 37, further comprising the step of presaturating said saturable inductor by applying a bias current.

39. The method of claim 38, wherein said bias current is applied to said saturable inductor through at least one linear inductor.

40. The method of claim 38, wherein said bias current is applied to said saturable inductor through an isolation transformer.

41. The method of claim 37, wherein said load comprises a gas discharge.

42. The method of claim 41, wherein said gas discharge is operable between transverse discharge electrodes.

43. The method of claim 41, wherein said load is a pulsed gas discharge laser.

44. The method of claim 43, wherein said pulsed gas discharge laser is an excimer laser.

45. The method of claim 44, wherein said excimer laser is selected from the group consisting of KrF excimer lasers and ArF excimer lasers.

46. The method of claim 37, further comprising the step of recovering pulse power not used in said load and returning said pulse power not used in said load to said capacitor.

* * * * *